United States Patent [19]
Cao et al.

[11] Patent Number: 6,111,300
[45] Date of Patent: Aug. 29, 2000

[54] MULTIPLE COLOR DETECTION ELEVATED PIN PHOTO DIODE ACTIVE PIXEL SENSOR

[75] Inventors: Min Cao, Mountain View; Paul J. Vande Voorde, San Mateo; Frederick A. Perner, Palo Alto; Dietrich W. Vook, Menlo Park, all of Calif.

[73] Assignee: Agilent Technologies, Palo Alto, Calif.

[21] Appl. No.: 09/203,445

[22] Filed: Dec. 1, 1998

[51] Int. Cl.⁷ .......................... H01L 31/00; H01L 31/075; H01L 31/105; H01L 31/117
[52] U.S. Cl. .......................... 257/440; 257/431; 257/458; 257/461; 257/656
[58] Field of Search ................... 257/431, 440, 257/461, 458, 656

[56] References Cited

U.S. PATENT DOCUMENTS

| | | | |
|---|---|---|---|
| 4,318,115 | 3/1982 | Yoshikawa et al. | 357/30 |
| 4,438,455 | 3/1984 | Tabei | 358/44 |
| 4,926,231 | 5/1990 | Hwang et al. | 357/30 |
| 5,557,133 | 9/1996 | De Cesare et al. | 257/440 |
| 5,700,467 | 12/1997 | Shima et al. | 136/249 |
| 5,731,621 | 3/1998 | Kosai | 257/440 |
| 5,945,722 | 8/1999 | Tsuei et al. | 257/440 |
| 5,965,875 | 10/1999 | Merrill | 250/226 |
| 5,998,806 | 12/1999 | Stiebig et al. | 257/55 |

FOREIGN PATENT DOCUMENTS

| | | | |
|---|---|---|---|
| 0682375 | 5/1995 | European Pat. Off. | H01L 31/11 |
| WO 98/22982 | 5/1998 | WIPO | H01L 27/48 |

OTHER PUBLICATIONS

G. N. Lu, et al; "Colour Detection Using a Buried Double P–N Junction Structure Implemented in the CMOS Process"; Electronic Letters, GB, IEE Stevenage, vol. 32, No. 6, pp. 594–596. Mar. 1996.

Klaus Eberhardt, et al; "Three–Color Sensor Based on Amorphous n–i–p–i–n Layer Sequence"; IEEE Transactions on Electron Devices, US, IEEE Inc., New York; vol. 42, No. 10; pp. 1763–1768, Oct. 1995.

Primary Examiner—David Hardy
Assistant Examiner—Allan R. Wilson
Attorney, Agent, or Firm—Brian Short

[57] ABSTRACT

A color detection active pixel sensor. The color detection active pixel sensor includes a substrate. A diode is electrically connected to a first doped region of the substrate. The diode conducts charge when the diode receives photons having a first range of wavelengths. The substrate includes a second doped region. The second doped region conducts charge when receiving photons having a second range of wavelengths. The photons having the second range of wavelengths passing through the diode substantially undetected by the diode. The substrate can include a doped well within the substrate. The doped well conducts charge when receiving photons having a third range of wavelengths. The photons having the third range of wavelengths pass through the diode substantially undetected by the diode.

18 Claims, 2 Drawing Sheets

FIG. 1

MULTIPLE COLOR DETECTION ELEVATED PIN PHOTO DIODE ACTIVE PIXEL SENSOR

FIELD OF INVENTION

This invention relates generally to photo diode active pixel sensors. In particular, it relates to an elevated multiple color detection photo diode active pixel sensor.

BACKGROUND

An array of photo pixel sensors detect the intensity of light received by the photo pixel sensors. The photo pixel sensors typically generate electronic signals that have amplitudes that are proportionate to the intensity of the light received by the photo pixel sensors. The photo pixel sensors can convert an optical image into a set of electronic signals. The electronic signals may represent intensities of colors of light received by the photo pixel sensors. The electronic signals can be conditioned and sampled to allow image processing.

Integration of the photo pixel sensors with signal processing circuitry is becoming more important because integration enables miniaturization and simplification of imaging systems. Integration of photo pixel sensors along with analog and digital signal processing circuitry allows electronic imaging systems to be low cost, compact and require low power.

Historically, photo pixel sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a prior art array of active pixel sensors. An array of sensors 12 are formed over a substrate 10. An array of color filters 14 is formed over the array of sensors 12. Light passes through the color filters 14 and is received by the array of sensors 12. The sensors 12 typically conduct charge at a rate that is proportional to the intensity of the light received by the sensors 12. Circuitry located on the substrate 10 provides determination of the amount of charge conducted by the sensors 12. Therefore, the sensors 12 provide detection of the intensity of the received light.

The array of color filters 14 includes filters which pass different wavelengths of light. For example, the array of color filters 14 can include blue light, green light and red light filters. The blue light filters only passes blue light, the green light filters only passes green light and the red light filters only pass red light. Generally, each sensor of the array of sensors 12 corresponds with a single color filter of the array of color filters 14. Color detection can be obtained by knowing which sensor corresponds with which type of color filter.

The active pixel sensor array of FIG. 1 is inefficient because up to 70% of the photons within the received light are lost during the filtering process. In addition, the forming the array of color filters is costly and requires valuable substrate 10 area.

It is desirable to have an array of active pixel sensors which provide efficient absorption of photons within light received by the array of active pixel sensors, and be able to detect the color of received light. It is also desirable that the array of active pixel sensors be manufacturable without an array of color filters.

SUMMARY OF THE INVENTION

The present invention is a color detection active pixel sensor which provides efficient absorption of photons of light received by the color active detection pixel sensor while providing detection of the color of the received light. The color detection is accomplished without color filters.

A first embodiment of this invention includes a color detection active pixel sensor. The color detection active pixel sensor includes a substrate. A diode is electrically connected to a first doped region of the substrate. The diode conducts charge when the diode receives photons having a first range of wavelengths. The substrate includes a second doped region. The second doped region conducts charge when receiving photons having a second range of wavelengths. The photons having the second range of wavelengths passing through the diode substantially undetected by the diode.

A second embodiment is similar to the first embodiment. The second embodiment further includes a doped well within the substrate. The doped doped well conducts charge when receiving photons having a third range of wavelengths. The photons having the third range of wavelengths pass through the diode substantially undetected by the diode.

A third embodiment is similar to the first embodiment. The third embodiment includes the first range of wavelengths corresponding approximately to the wavelength of blue light, the second range of wavelengths corresponding approximately to the wavelength of green light, and the third range of wavelengths corresponding approximately to the wavelengths of red light.

Other aspects and advantages of the present invention will become apparent from the following detailed description, taken in conjunction with the accompanying drawings, illustrating by way of example the principles of the invention.

DETAILED DESCRIPTION

Figure 1:
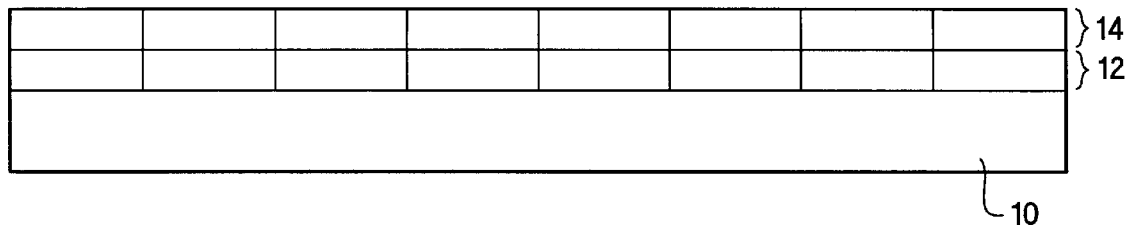
FIG. 1 shows a cross-section of a prior art array of photo diode sensor.

As shown in the drawings for purposes of illustration, the invention is embodied in a elevated multiple color detection photo diode active pixel sensor. The photo diode active pixel sensor efficiently detects the color of received light. The photo diode active pixel sensor does not require a separate color filter.

Figure 2:
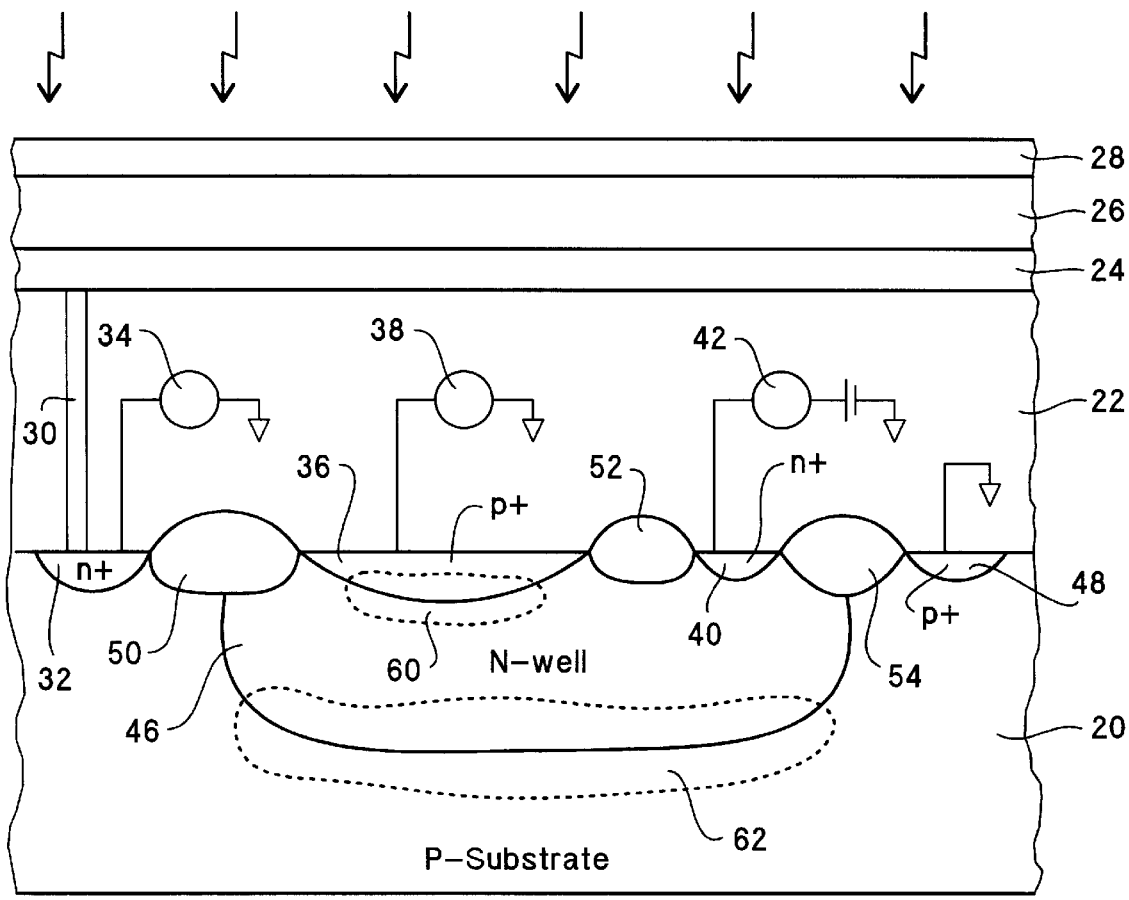
FIG. 2 shows an embodiment of the invention.

FIG. 2 shows an embodiment of the invention. The embodiment includes a substrate 20. An interconnection layer 22 is formed adjacent to the substrate 20. A diode including a P-layer 28, an I-layer 26 and an N-layer 24 is formed adjacent to the interconnection layer 22. The interconnection layer 22 includes a conductive interconnect 30 which electrically connects the N-layer 24 of the diode to the substrate 20.

When reverse biased, the diode conducts charge when the diode receives light. The diode can be formed to detect varying wavelengths of light depending upon the structure of the diode. In particular, the thickness of the I-layer 26 of the diode can be adjusted to vary the wavelengths of light detectable by the diode.

The light absorption characteristics of a particular diode is dependent upon an absorption length L0 associated with the diode. The absorption length L0 is a constant which is generally unique for a particular material. The absorption length L0 of a given material will typically vary depending upon the wavelength of the light being receive by the diode.

Figure 3:
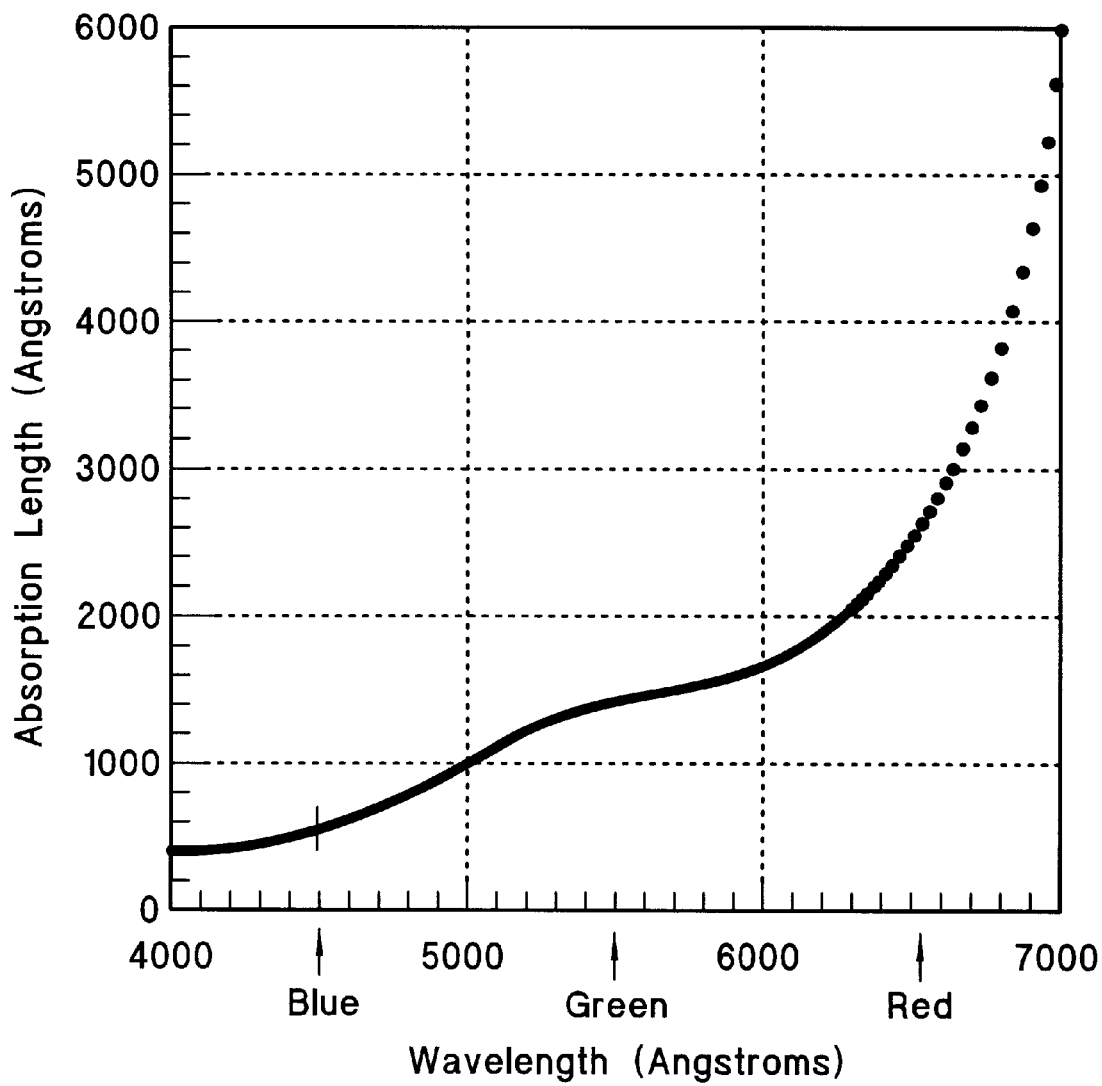
FIG. 3 is a curve which depicts the relationship between the thickness of an I-layer of a PIN diode and the wavelength of light absorbed by the I-layer.

FIG. 3 is a plot which depicts the absorption length L0 of an amorphous silicon for wavelengths of light varying from 4000 Angstroms to about 7000 Angstroms. The absorption length L0 varies from about 200 Angstroms to about 6000 Angstroms for wavelengths between 4000 Angstroms and 7000 Angstroms.

The amount of light absorbed by the diode can be determined by the following relationship:

Absorbed light=$I_0(1-e^{-(x/L0)})$ where $I_0$ is the amount of light of a given wavelength received by the diode, and x is the width of the I-layer 26.

The plot of FIG. 3 shows that the absorption length L0 for amorphous silicon is about 600 Angstroms for blue light having a wavelength of about 4500 Angstroms. The amount of blue light absorbed by a diode having an I-layer width of 600 Angstroms is about $I_0(1-e^{-(1)})$ or about 63% of the blue light received by the diode. The amount of red light having a wavelength of about 6500 Angstroms which is absorbed by the diode having an I-layer thickness of 600 Angstroms is about $I_0(1-e^{-(600/4000)})$, which is a substantially smaller than the amount of blue light absorbed.

An embodiment of the invention includes the thickness of the I-layer being between approximately 500 and 800 Angstroms. This embodiment includes the PIN diode detecting blue light having a wavelength of about 4500 Angstroms. The light having wavelengths greater than that of blue light pass through the PIN diode substantially undetected or absorbed.

The thickness of the I-layer can be controlled by controlling the amount of I-layer material deposited during the formation of the PIN diode.

The substrate 20 includes a first doped region 32. The first doped region 32 is electrically connected to the N-layer 24 of the diode through the conductive interconnect 30. When the diode receives light within the diodes detectable range of wavelengths; the diode conducts charge and charge accumulates at the first doped region 32.

A first charge sensor 34 is connected to the first doped region 32. The first charge sensor 34 can be either a voltage detection sensor or a current detection sensor. However, the first charge sensor 34 provides a measurement of the amount of charge accumulated at the first doped region 32. Therefore, the first charge sensor 34 provides a measurement of the amount or intensity of light received by the diode. If the diode is formed to detect blue light, the first charge sensor 34 provides an indication of the amount of blue light received by the diode. Voltage detection sensors and current detection sensors are well understood in the art of electronics. The first charge sensor 34 is depicted in FIG. 2 to show that the first charge sensor 34 exists. The first charge sensor 34 is formed by circuitry within the substrate 20.

A second doped region 36 is formed in the substrate 20. The second doped region 36 is formed to provide detection of light having wavelengths greater than the wavelength of the light detected by the diode connected to the first doped region 32. A depletion region 60 associated with the second doped region 36 receive photons which are converted to electron hole pairs. The result is that the second doped region 36 collects charge when receiving light of a detectable wavelength. An embodiment of the invention includes the second doped region 36 collecting charge when receiving light having the wavelength of green light.

Light is detected by the second doped region 36 and depletion region 60 if the light has a wavelength that is within the range of wavelengths of light that the depletion region 60 absorbs. The range of wavelengths of light which are absorbed by the depletion region 60 is dependent on several processing parameters associated with the second doped region 36 and the depletion region 60. More specifically, the range of wavelengths of light which are detected by the second doped region 36 is dependent upon the junction depth of the second doped region 36, and the depletion region 60 associated with the second doped region 36.

As is well known in the art of semiconductor processing, the junction depth of the second doped region 36 is dependent upon the implant depth and anneal of the second doped region 36. That is, during the formation of the second region 36, implant depth and anneal can be used to control the junction depth of the second doped region 36.

Photons absorbed by the depletion region 60 cause the second doped region 36 to conduct and generate charge. The generation of charge causes a current (green current) to be conducted from a third doped region 40 to the second doped region 36. The junction depth and depletion region 60 of the second doped region 36 can be experimentally controlled to set the wavelength of the photons which are absorbed by the depletion region 60 to the desired wavelength. More specifically, the implant depth and anneal of the second doped region can be experimentally manipulated to set the wavelength of the photons which are absorbed by the depletion region 60 to the desired wavelength. As previously stated, an embodiment of the invention includes the second doped region 36 collecting charge (conducting current) when receiving light (photons) having the wavelength of green light.

A second charge sensor 38 is connected to the second doped region 36. The second charge sensor 38 can be either a voltage detection sensor or a current detection sensor. However, the second charge sensor 38 provides a measurement of the amount of charge accumulated at the second doped region 36. Therefore, the second charge sensor 38 provides a measurement of the amount or intensity of light received by the second doped region 36. If the second doped region 36 is formed to detect green light, the second charge sensor 38 provides an indication of the amount of green light received by the second doped region 36. Voltage detection sensors and current detection sensors are well understood in the art of electronics. The second charge sensor 38 is depicted in FIG. 2 to show that the second charge sensor 38 exists. The second charge sensor 38 is formed by circuitry within the substrate 20.

The third doped region 40 is formed in the substrate 20. The third doped region 40 provides an electrical connection to an N-well 46. The N-well 46 and an associated depletion region 62 are formed to provide detection of light having wavelengths greater than the wavelength of the light detected by the second doped region 36. The depletion region 62 receives photons which are converted to electron hole pairs. The result is that the N-well 46 collects charge when receiving light of a detectable wavelength. An embodiment of the invention includes the N-well 46 collecting charge when receiving light having the wavelength of red light.

Light is detected by the N-well 46 and the depletion region 62 if the light has a wavelength that is within the range of wavelengths of light that the depletion region 62 absorbs. The range of wavelengths of light which are absorbed by the depletion region 62 is dependent on several processing parameters associated with the N-well 46. More specifically, the range of wavelengths of light which are absorbed by the depletion region 62 is dependent upon the junction depth of the N-well 46, and the depletion region 62 associated with the N-well 46.

As is well known in the art of semiconductor processing, the junction depth of the N-well 46 is dependent upon the implant depth and anneal of the N-well 46. That is, during the formation of the N-well 46, implant depth and anneal can be used to control the junction depth of the N-well 46.

Photons absorbed by the depletion region 62 cause the N-well 46 to conduct and accumulate charge. The accumulation of charge causes a current (red current) to be conducted from the third doped region 40 to the depletion region 62 between the N-well 46 and the substrate 20. The junction depth and depletion region 62 of the N-well 46 can be experimentally controlled to set the wavelength of the photons which are absorbed by the depletion region 62 to a desired wavelength. More specifically, the implant depth and anneal of the N-well 46 can be experimentally manipulated to set the wavelength of the photons which are absorbed by the depletion region 62 to the desired wavelength. As previously stated, an embodiment of the invention includes the N-well 46 collecting charge (conducting current) when receiving light (photons) having the wavelength of red light.

A third charge sensor 42 is connected to the third doped region 40. The third charge sensor 42 can be either a voltage detection sensor or a current detection sensor. However, the third charge sensor 42 provides a measurement of the amount of charge accumulated at the third doped region 40. As previously mentioned, current (green current) is conducted from the third doped region to the second doped region 36. Additionally, current (red current) is conducted from the third doped region 40 to the depletion region 62 of the N-well 46. The third charge sensor 42 provides a measurement of the amount charge or current conducted by the third doped region 40. The charge accumulated at the third doped region 40 can be used to determine the amount of green-red light received by the pixel sensor. Therefore, the third charge sensor 42 provides an indication of the amount of green-red light received by the pixel sensor. As previously mentioned, the second charge sensor 38 provides an indication of the amount of green light. The amount of received red light can be determined by subtracting the response of the second charge sensor 38 from the response of the third charge sensor 42. Voltage detection sensors and current detection sensors are well understood in the art of electronics. The first charge sensor 34, the second charge sensor 38 and the third charge sensor 42 are depicted in FIG. 2 to show that the sensors exists. The first charge sensor 34, the second charge sensor 38 and the third charge sensor 42 are formed by circuitry within the substrate 20.

If the first charge sensor 34 provides an indication of the amount of blue light received by the diode, the second charge sensor 38 provides an indication of the amount of green light received by the second doped region 36, and the third charge sensor 42 provides an indication of the amount of green-red light received by the third doped region 40, it is possible to determine the amount of blue, green or red light received by the multiple color detection photo diode active pixel sensor of the invention.

The embodiment of FIG. 2 further includes the substrate 20 being P-doped. The first doped region 32 is an N-island.

The P-doped substrate 20 includes the N-well 46. The second doped region 36 is located within the N-well 46, and is a P-island. The third doped region 40 is also located within the N-well 46, and is an N-island. A fourth doped region 48 is included for the purpose of providing a ground connection to the substrate 20. The fourth doped region 48 of this embodiment is a P-island.

Field oxide regions 50, 52, 54 are include for the purpose of providing isolation between each of the doped regions 32, 36, 40, 48.

The process for forming the substrate (P-substrate) 20 is well known in the art of semiconductor fabrication. The N-well 46 is lightly doped and can be formed through deep ion implantation. The doped regions 32, 36, 40, 48 are heavily doped and can also be formed through ion implantation. The field oxide regions 50, 52, 54 can be formed through trench isolation or local oxidation of silicon (LOCOS). Both trench isolation and LOCOS are well understood in the art of semiconductor fabrication. The interconnection layer 22 is a standard CMOS interconnection structure. As previously stated, the first charge sensor 34, the second charge sensor 38 and the third charge sensor 42 are formed by circuitry within the substrate 20. The N-layer 24, the I-layer 26 and the P-layer 28 can be deposited through plasma enhance chemical vapor deposition (PECVD).

Although specific embodiments of the invention have been described and illustrated, the invention is not to be limited to the specific forms or arrangements of parts so described and illustrated. The invention is limited only by the claims.

What is claimed:

1. A color detection active pixel sensor comprising:
   a substrate;
   a diode located adjacent to the substrate, the diode electrically connected through an interconnection layer to a first doped region of the substrate, the diode conducting charge when the diode receives photons having a first range of wavelengths; and
   a second doped region within the substrate, the second doped region conducting charge when receiving photons having a second range of wavelengths, the photons having the second range of wavelengths passing through the diode substantially undetected by the diode.

2. The color detection active pixel sensor as recited in claim 1, further comprising a doped well within the substrate, the doped well conducting charge when receiving photons having a third range of wavelengths, the photons having the third range of wavelengths passing through the diode substantially undetected by the diode.

3. The color detection active pixel sensor as recited in claim 1, wherein the diode comprises a PIN diode.

4. The color detection active pixel sensor as recited in claim 1, wherein the first range of wavelengths correspond approximately to the wavelength of blue light.

5. The color detection active pixel sensor as recited in claim 1, wherein the second range of wavelengths correspond approximately to the wavelength of green light.

6. The color detection active pixel sensor as recited in claim 2, wherein the third range of wavelengths correspond approximately to the wavelength of red light.

7. The color detection active pixel sensor as recited in claim 1, further comprising a fourth doped region within the substrate, the fourth doped region being electrically connected to a substrate ground.

8. The color detection active pixel sensor as recited in claim 1, further comprising a first insulation region between the first doped region and the second doped region.

9. The color detection active pixel sensor as recited in claim 2, further comprising a third doped region electrically connected to the doped well.

10. The color detection active pixel sensor as recited in claim 9, further comprising a second insulation region between the second doped region and the third doped region.

11. The color detection active pixel sensor as recited in claim 2, wherein the substrate is p-doped.

12. The color detection active pixel sensor as recited in claim 11, wherein the doped well comprises an N-well.

13. The color detection active pixel sensor as recited in claim 12, wherein the N-well comprises the second doped region.

14. The color detection active pixel sensor as recited in claim 13, wherein the N-well comprises the third doped region.

15. The color detection active pixel sensor as recited in claim 3, wherein the PIN diode comprises amorphous silicon.

16. The color detection active pixel sensor as recited in claim 1, further comprising a first charge sensor connected to the first doped region for detecting a first amount of charge conducted by the diode.

17. The color detection active pixel sensor as recited in claim 1, further comprising a second charge sensor connected to the second doped region for detecting a second amount of charge conducted by the second doped region.

18. The color detection active pixel sensor as recited in claim 9, further comprising a third charge sensor connected to the third doped region for detecting a third amount of charge conducted by the doped well.

* * * * *